(12) United States Patent
Fukushima (10) Patent No.: US 8,921,275 B2
(45) Date of Patent: Dec. 30, 2014

(54) TAPE-SHAPED BASE FOR SUPERCONDUCTING WIRE, AND SUPERCONDUCTING WIRE

(75) Inventor: Hiroyuki Fukushima, Chiyoda-ku (JP)

(73) Assignee: Furukawa Electric Co., Ltd., Tokyo (JP)

( * ) Notice: Subject to any disclaimer, the term of this patent is extended or adjusted under 35 U.S.C. 154(b) by 191 days.

(21) Appl. No.: 13/394,217

(22) PCT Filed: Sep. 6, 2010

(86) PCT No.: PCT/JP2010/065241
§ 371 (c)(1),
(2), (4) Date: Mar. 5, 2012

(87) PCT Pub. No.: WO2011/027886
PCT Pub. Date: Mar. 10, 2011

(65) Prior Publication Data
US 2012/0165199 A1    Jun. 28, 2012

(30) Foreign Application Priority Data

Sep. 7, 2009  (JP) ................................. 2009-205584

(51) Int. Cl.
| | |
|---|---|
| *H01B 12/06* | (2006.01) |
| *H01B 12/02* | (2006.01) |
| *H01L 39/02* | (2006.01) |
| *H01L 39/24* | (2006.01) |
| *C23C 14/08* | (2006.01) |
| *C23C 14/46* | (2006.01) |
| *C23C 14/56* | (2006.01) |
| *C23C 28/04* | (2006.01) |

(52) U.S. Cl.
CPC .......... *H01L 39/2461* (2013.01); *C23C 14/083* (2013.01); *C23C 14/46* (2013.01); *C23C 14/562* (2013.01); *C23C 28/042* (2013.01); *Y10S 505/704* (2013.01)
USPC ........... 505/237; 505/230; 505/704; 428/472; 428/701; 174/125.1

(58) Field of Classification Search
CPC . H01L 39/24; H01L 39/2461; H01L 39/2454; H01L 39/2458; H01L 39/2435; H01L 39/248; H01B 12/00; H01B 12/04; H01B 12/06; H01B 12/10; C23C 14/46; C23C 14/562; C23C 14/3442; C23C 14/08; C23C 14/083; C30B 25/02; C30B 25/025; C30B 25/18; C30B 25/183
USPC ......... 505/230, 236–239, 430, 470, 473, 704; 428/472, 702, 930; 174/125.1; 29/599
See application file for complete search history.

(56) References Cited

U.S. PATENT DOCUMENTS

| | | | |
|---|---|---|---|
| 2004/0018394 A1* | 1/2004 | Jia et al. ........................ | 428/701 |
| 2005/0239659 A1 | 10/2005 | Xiong et al. | |

(Continued)

FOREIGN PATENT DOCUMENTS

| | | | | |
|---|---|---|---|---|
| JP | 58097881 | * 10/1983 | .............. | H01L 39/12 |
| JP | 4 331795 | 11/1992 | | |

(Continued)

OTHER PUBLICATIONS

Norton, "Synthesis and properties of epitaxial electronic oxide thin-film materials," Materials Science and Engineering R 43 (2004) 139-247.*

(Continued)

*Primary Examiner* — Stanley Silverman
*Assistant Examiner* — Kallambella Vijayakumar
(74) *Attorney, Agent, or Firm* — Oblon, Spivak, McClelland, Maier & Neustadt, L.L.P.

(57) ABSTRACT

A tape-shaped base for a superconducting wire, which simplifies the intermediate layer and thus enables production of a superconducting wire at lower cost, and which is capable of improving the characteristics (such as electrical conduction and handling properties) of a superconducting wire; and a superconducting wire. Specifically disclosed is a tape-shaped base for a superconducting wire, which is obtained by forming an intermediate layer on a metal substrate. In the tape-shaped base for a superconducting wire a biaxially oriented layer of the intermediate layer is configured of a niobium monoxide (NbO) layer that is formed by depositing vapor deposition particles from a vapor deposition source on a film formation surface.

8 Claims, 4 Drawing Sheets

(56) References Cited

U.S. PATENT DOCUMENTS

2007/0149410 A1 6/2007 Xiong et al.
2011/0287943 A1 11/2011 Fukushima

FOREIGN PATENT DOCUMENTS

| | | |
|---|---|---|
| JP | 2007 532775 | 11/2007 |
| JP | 2009 522733 | 6/2009 |
| WO | WO 2007/040567 A2 | 4/2007 |
| WO | WO 2009/054950 A1 | 4/2009 |

OTHER PUBLICATIONS

International Search Report Issued Dec. 7, 2010 in PCT/JP10/65241 Filed Sep. 6, 2010.

Chinese Office Action issued Mar. 12, 2012 in patent application No. 201080003237.5 with English translation.

W. W. Schulz, et al., "Band structure and electronic transport properties of the superconductor NbO", Physical Review B, vol. 46, No. 21, Dec. 1, 1992, pp. 14001-14004.

Office Action issued Nov. 12, 2012 in Chinese Application No. 201080003237.5 (With English Translation).

"The Effect of Vacancies on the Electronic Structure of NbO," E. Wimmer, et al., Journal of Physics and Chemistry of Solids, Pergamon Press, London, GB, vol. 43, No. 5 (9 pages), 1982.

Extended European Search Report dated Jun. 30, 2014 in corresponding European application No. 10813832.2, (6 pages).

Japanese Office Action mailed on Sep. 9, 2014 in corresponding Japanese Patent Application No. 2011-529969 with English translation.

* cited by examiner

TAPE-SHAPED BASE FOR SUPERCONDUCTING WIRE, AND SUPERCONDUCTING WIRE

TECHNICAL FIELD

The present invention relates to a tape-shaped base for a superconducting wire used for a superconducting device, such as a superconducting cable and a superconducting magnet, and more particularly to the configuration of an intermediate layer formed on a metal substrate.

BACKGROUND ART

RE series superconductors (RE: rare earth element) is conventionally known as a kind of high temperature superconductors, which show superconductivity at a liquid nitrogen temperature (77 K) or more. In particular, an yttrium series superconductor expressed by a chemical formula $YBa_2Cu_3O_{7-y}$ is typical (hereinafter referred to as a Y series superconductor or a YBCO).

A superconducting wire using an RE series superconductor (hereinafter referred to as an RE series superconducting wire) generally has a laminated structure in which an intermediate layer, a layer of an RE series superconductor (hereinafter referred to as an RE series superconducting layer), and a stabilization layer are formed on a tape-shaped metal substrate in this order.

The RE series superconducting wire is, for example, manufactured as follows: a film of a biaxially oriented intermediate layer is formed on a low magnetic non-oriented metal substrate (for example, HASTELLOY (registered trademark)), and a film of an RE series superconducting layer is formed on the biaxially oriented intermediate layer by Pulsed Laser Deposition (PLD), Metal Organic Chemical Vapor Deposition (MOCVD), or the like.

It is known that the voltage-current characteristics of such a high temperature superconducting wire greatly depends on the crystal orientation, especially the biaxial orientation, of the superconductor. Accordingly, it is necessary to improve the crystallinity of an intermediate layer, which is used as a foundation, in order to obtain a superconducting layer having a high biaxial orientation. As one of the methods, Ion Beam Assisted Deposition (IBAD) is disclosed in Patent Documents 1 and 2. The IBAD method is a method of film formation by depositing particles evaporated from an evaporation source while radiating an assist ion beam to a deposition aspect from an oblique direction.

Patent Document 1 lists yttrium-stabilized zirconia (YSZ), magnesium oxide (MgO), and strontium titanate ($SrTiO_3$) as the evaporation sources applicable to the IBAD method. Moreover, Patent Document 2 cites a fluorite type material ($CeO_2$, YSZ, and the like), a pyrochlore type material (GZO ($Gd_2Zr_2O_7$) and the like), a rare earth C type material ($Y_2O_3$ and the like), a rock salt type material (MgO and the like), $ReO_3$ type material ($WO_3$ and the like), and perovskite type material ($LaAlO_3$ and the like) as the evaporation sources applicable to the IBAD method. In particular, a thin film made of MgO, which is a rock salt type material, enables the obtainment of a high biaxial orientation, and the thin film made of MgO is accordingly the main current of development.

The conventional superconducting wire includes a diffusion preventing layer (hereinafter referred to as a barrier layer) on the metal substrate thereof lest the diffusion of cations (Ni, Mo, Mn, and the like) from the metal substrate should reach the superconducting layer, and furthermore, a reaction suppressing layer (hereinafter referred to as a bed layer) suppressing the reactions of the diffusion preventing layer and MgO. Moreover, a cap layer, which is made of $CeO_2$ or the like, is formed on the biaxially oriented layer of the conventional superconducting wire in order to protect the biaxially oriented layer, made of MgO, which easily reacts with the air, and to enhance the lattice matching with the superconducting layer (for example, a YBCO).

Figure 4:
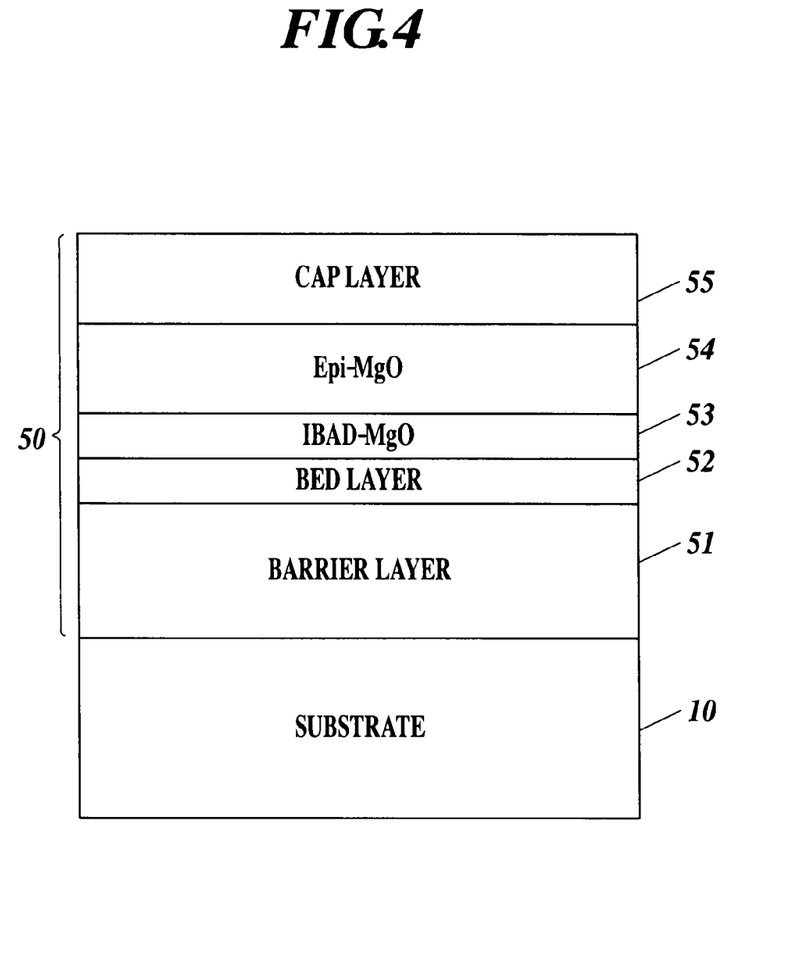
FIG. 4 This is a view showing the structure of a conventional tape-shaped base for a superconducting wire.

Consequently, as shown in FIG. 4, the intermediate layer 50 of the conventional superconducting wire is composed of the barrier layer 51, the bed layer 52, the biaxially oriented layers 53 and 54, and the cap layer 55. Incidentally, in FIG. 4, the biaxially oriented layer 53 is an MgO layer formed as a film by the IBAD method, and the biaxially oriented layer 54 is an MgO layer formed as a film on the IBAD-MgO layer 53 by the PLD method or the like.

In the following, a long tape-shaped base composed of a metal substrate and an intermediate layer will be called a tape-shaped base for a superconducting wire. A film of a superconducting layer made of the YBCO or the like is formed on the tape-shaped base for a superconducting wire (on the cap layer 55 in FIG. 4).

PRIOR ART DOCUMENTS

Patent Documents

Patent Document 1: JP-A-H04-331795
Patent Document 2: JP-A-2007-532775

SUMMARY OF THE INVENTION

Problems to be Solved by the Invention

As described above, if the biaxially oriented layer in an intermediate layer is made of MgO, because MgO easily reacts with the air and is unstable under the exposure to the air, there is a possibility that problems are brought about pertaining to the corrosion resistance and the exfoliation strength of the superconducting wire.

The present invention aims at providing a tape-shaped base for a superconducting wire and a superconducting wire, each capable of achieving the cost reduction of the superconducting wire by the simplification of the intermediate layer thereof and capable of improving the characteristics (such as voltage-current characteristics and handling performance) of the superconducting wire.

Means for Solving the Problems

The invention of claim 1 is made for achieving the object mentioned above and is a tape base for a superconducting wire including a metal substrate and an intermediate layer formed on the metal substrate, wherein the intermediate layer includes a biaxially oriented layer which consists essentially of niobium monoxide (NbO) and formed by deposition of particles evaporated from an evaporation source and deposited onto a deposition aspect.

The invention of claim 2 is the tape base for a superconducting wire according to claim 1, wherein an average film thickness of the biaxially oriented layer is within a range of 0.4-500 nm.

The invention of claim 3 is a tape base for a superconducting wire according to claim 1 or 2, wherein the intermediate layer includes a diffusion preventing layer formed on a surface of the metal substrate.

Here, the "diffusion preventing layer" means a layer having the function of preventing the diffusion of cations (Ni, Mo, Mn, and the like) from the metal substrate from reaching the superconducting layer, and includes the case of having other functions, for example, the function of improving the biaxial orientation, together with the diffusion preventing function.

The invention of claim 4 is a tape base for a superconducting wire according to claim 3, wherein the diffusion preventing layer consists essentially of a material selected from the group consisting of $Al_2O_3$ or $Cr_2O_3$.

The invention of claim 5 is a tape base for a superconducting wire according to any one of claims 1-4, wherein a film of the biaxially oriented layer is formed by the deposition of the particles evaporated from the evaporation source and deposited onto the deposition aspect while radiating an ion beam from an oblique direction to the deposition aspect.

The invention of claim 6 is a tape base for a superconducting wire according to any one of claims 1-5, wherein the intermediate layer includes a cap layer formed on a surface of the biaxially oriented layer.

The invention of claim 7 is a superconducting wire including the tape base for a superconducting wire according to any one of claims 1-6 and a superconducting layer formed on the surface of the tape base for a superconducting wire.

In the following, the circumstances that led the present invention to the completion thereof will be described.

The inventor of the present invention groped for an alternative material of MgO, which had been the main current of the development of the biaxially oriented layers of superconducting wires, and aimed at Nb oxide, the examples of which were not known publicly. Then, because niobium monoxide (NbO) is stable under the exposure to the air, the improvement of the corrosion resistance and the exfoliation strength of the superconducting wire are capable of being expected, and then the inventor obtained the opinion that the niobium monoxide is suitable as an alternative material of MgO. Moreover, a rock salt type NbO has a lattice constant a that is almost the same as that of MgO ($a_{MgO}$=0.4211 nm, and $a_{NbO}$=0.4210 nm), and then the inventor obtained the opinion that the rock salt type NbO was capable of being applied also from the view point of the lattice matching with the superconducting layer.

However, because Nb oxide can take various oxidized states, such as NbO, $NbO_2$, $Nb_2O_3$, and $Nb_2O_5$, the deposition window thereof is narrow, and the deposition condition thereof is severe. Moreover, it is reported that NbO took a CsCl type structure, the density of which is low, besides the rock salt type thereof. Consequently, the inventor was anxious about the practical realization of the rock salt type NbO as a biaxially oriented layer.

The examination of such an anxious matter made the inventor found that the IBAD method, which had conventionally been used for the deposition of a biaxially oriented layer, enabled the obtainment of a better biaxially oriented film on the side on which a supplied oxygen quantity was less. Consequently, the inventor considered that the deposition of a biaxially oriented layer made of NbO by low oxygen supply, which had originally been pursued in order to form a high quality biaxially oriented layer film.

Moreover, the IBAD method was used for forming an amorphous layer to have a high density besides the deposition of a biaxially oriented layer. The IBAD method had actually been used for the deposition of the $Al_2O_3$ barrier layer of a superconducting wire. Consequently, the inventor considered that if NbO was formed as a film by the IBAD method, a low density NbO of the CsCl type structure would not be produced, but a high density NbO of the rock salt type structure would be produced.

Then, the inventor repeatedly examined the laminated structures of the intermediate layers at the time of configuring the biaxially oriented layers with NbO. Then, the inventor experimentally ascertained that the superconductivity characteristics, such as voltage-current characteristics, were high at the time of making the laminated structure as a superconducting wire, and the inventor completed the present invention.

Effects of the Invention

By a tape-shaped base for a superconducting wire according to the present invention, the biaxially oriented layer is made of NbO, whose reaction with the air is suppressed, and consequently, the collapse of the orientation of the biaxially oriented layer is prevented, and the corrosion resistance thereof and the exfoliation strength thereof are improved. The characteristics of a superconducting wire, such as the voltage-current characteristics thereof and the handling performance thereof, can thereby be improved.

BEST MODE FOR CARRYING OUT THE INVENTION

In the following, an embodiment of the present invention will be described in detail.

Figure 1:
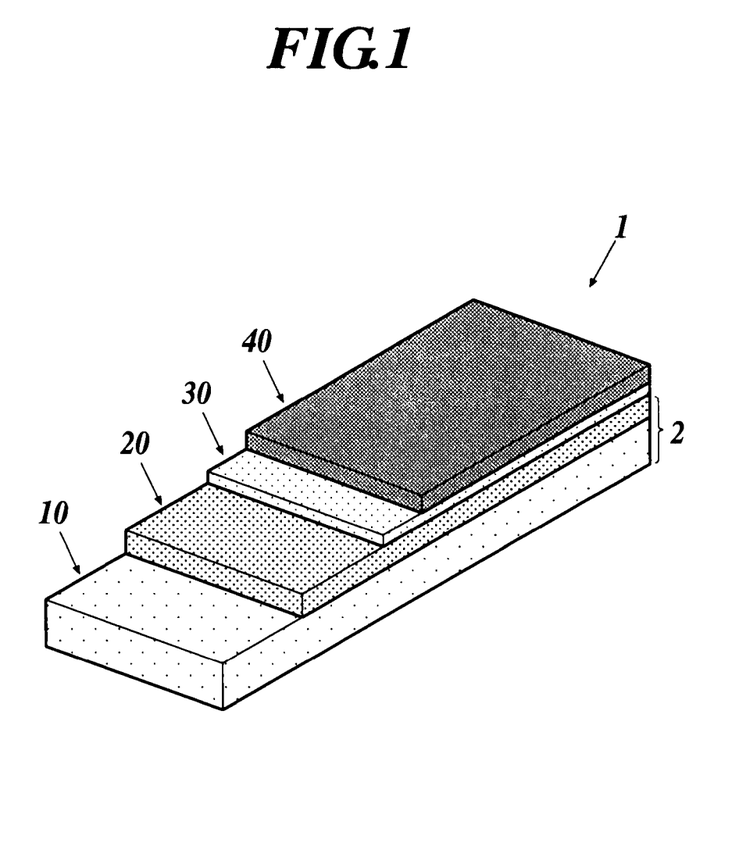
FIG. 1 This is a view showing a laminated structure of a superconducting wire according to an embodiment.
Figure 2:
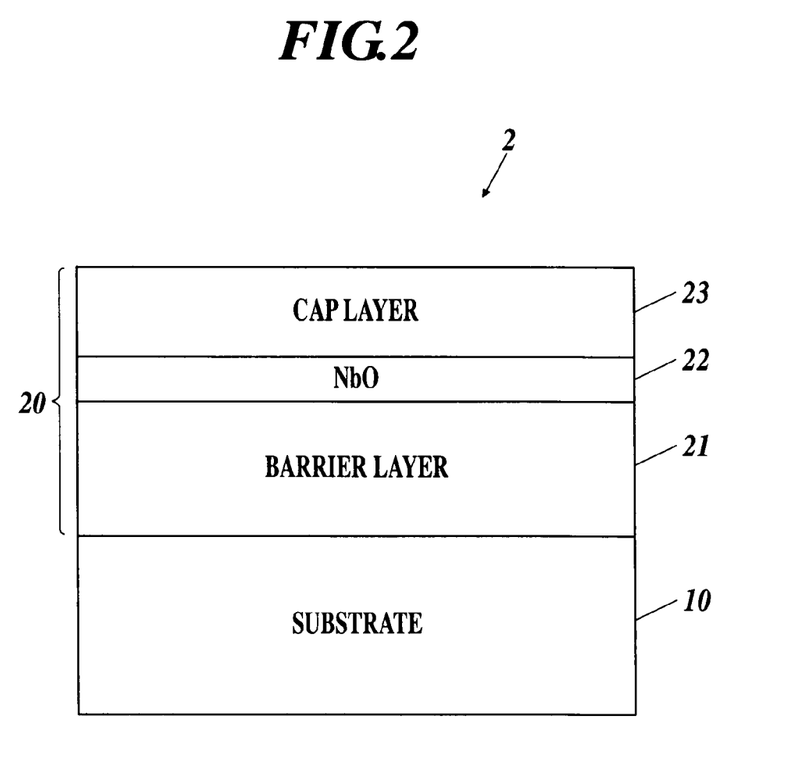
FIG. 2 This is a view showing the sectional structure of a tape-shaped base for a superconducting wire according to the embodiment.

FIG. 1 is a view showing the laminated structure of a superconducting wire according to the present embodiment. Moreover, FIG. 2 is a view showing the sectional structure of a tape-shaped base for a superconducting wire according to the present embodiment.

As shown in FIG. 1, the Y series superconducting wire 1 has a laminated structure in which an intermediate layer 20, a superconducting layer 30, and a stabilization layer 40 are formed on a tape-shaped metal substrate 10 in order. The tape-shaped metal substrate 10 and the intermediate layer 20 in FIG. 1 constitute a tape-shaped base for a superconducting wire 2 according to the present invention.

In the present embodiment, the metal substrate 10 is a low magnetic non-oriented metal substrate (such as HASTELLOY (registered trademark) and austenitic stainless steel). As shown in FIG. 2, the intermediate layer 20 is composed of a barrier layer 21, a biaxially oriented layer 22, and a cap layer 23. The superconducting layer 30 is an RE series superconducting layer composed of an RE series superconductor, and, for example, is a YBCO superconducting layer formed as a film by the MOCVD method. The stabilization layer 40 is formed as a film on the upper surface of the superconducting layer 30. The stabilization layer 40 is made of silver and formed by, for example, the sputtering method.

The barrier layer 21, constituting the intermediate layer 20, is a layer for preventing the diffusion of the constituent elements of the metal substrate 10, and, is formed as a film by, for example, the sputtering method. As the materials of the barrier layer 21, GZO, YAlO, YSZ, $Y_2O_3$, $Gd_2O_3$, $Al_2O_3$, $B_2O_3$, $Sc_2O_3$, $Cr_2O_3$, REZrO, $RE_2O_3$, and the like can be used. Here, the RE should be composed of a material selected from the group consisting of at least one rare earth element and their combinations. Incidentally, the barrier layer 21 may has other functions such as the function of improving a biaxial orientation besides the diffusion preventing function. Incidentally, in order to make the barrier layer 21 have the function of improving the biaxial orientation, it is preferable to use GZO as the material of the barrier layer 21. The biaxially oriented layer 22 is a polycrystalline thin film made of NbO for orienting the crystal of the superconducting layer 30 into a predetermined direction, and is formed as a film by the IBAD method, which will be described later. The cap layer 23 is a layer for protecting the biaxially oriented layer 22 and enhancing the lattice matching with the superconducting layer 30, and is formed as a film by, for example, the sputtering method. As the materials of the cap layer 23, any one kind of $CeO_2$, $LaMnO_3$ (LMO), and $SrTiO_3$ (STO), or a combination of two kinds of them can constitutes the material. However, because the reaction of NbO with the air is suppressed in comparison with that of MgO, the cap layer 23 is not necessarily needed when the biaxially oriented layer 22 is made of NbO.

Figure 3:
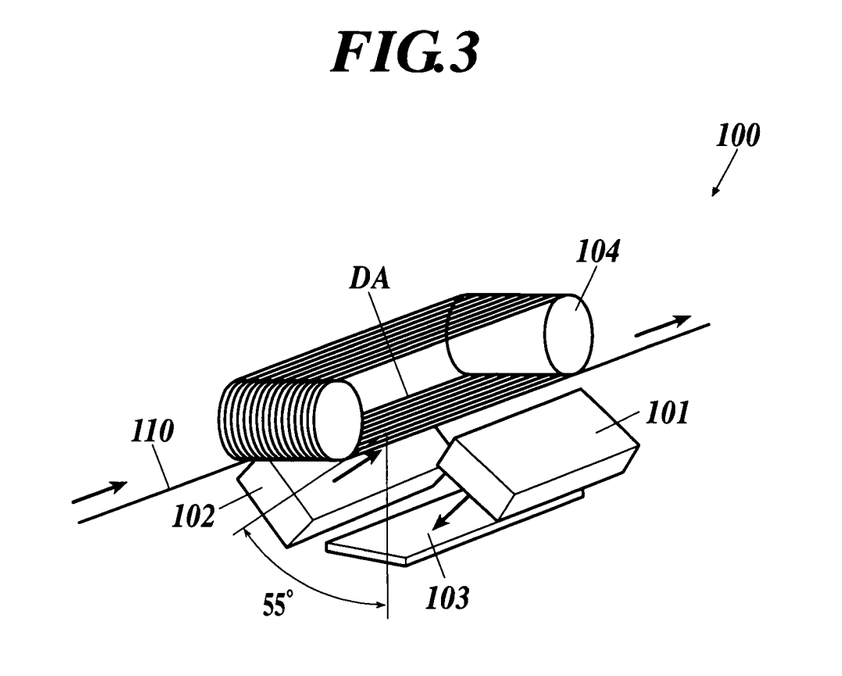
FIG. 3 This is a view showing the schematic configuration of a sputtering device used for the IBAD method.

FIG. 3 is a view showing the schematic configuration of a sputtering device used for the IBAD method. As shown in FIG. 3, the sputtering device 100 is composed of a sputter ion source 101, an assist ion source 102, a target (evaporation source) 103, and a base material conveying section 104. The sputtering device 100 is housed in a vacuum container (not shown), and is made to be capable of depositing evaporated particles on a deposition aspect DA in a vacuum. Moreover, the sputtering device 100 is configured to have a not-shown heating heater to enable the heating of the deposition aspect DA to a desired temperature.

When a film of the biaxially oriented layer 22 is formed, the tape-shaped metal substrate 10 on which the barrier layer 21 has been formed is used as a base material 110, and the base material 110 is led to be conveyed into the sputtering device 100 by the base material conveying section 104.

Each of the sputter ion source 101 and the assist ion source 102 is configured to have an ion gun accelerating the ions generated by an ion generator and emit the generated ions, and to radiate desired ions to the target 103 and the deposition aspect DA, respectively.

When an ion beam is radiated from the sputter ion source 101 to the target 103, the particles constituting the target 103 are flicked out. The flicked-out particles (evaporated particles) deposit on the deposition aspect DA of the opposed base material 110 and form a polycrystalline thin film. At this time, the assist ion source 102 radiates an assist ion beam from the oblique direction (for example, 45° to the normal line direction of the deposition aspect DA) to the deposition aspect DA of the base material 110. The a-axis and the b-axis of the polycrystalline thin film formed on the deposition aspect DA of the base material 110 are thereupon oriented, and a film of a biaxially oriented layer is formed. By performing the deposition while moving the base material 110 with the base material conveying section 104, the biaxially oriented layer is uniformly formed on the long base material 110.

The biaxially oriented layer 22 shown in FIG. 2 can be formed as a film by the use of the sputtering device 100 shown in FIG. 3. In the present embodiment, because the biaxially oriented layer 22 is made of a rock salt type NbO, NbO is used as the target 103.

Incidentally, the average film thickness of the biaxially oriented layer 22 is within a range from 0.4 nm to 500 nm. If the film thickness is less than 0.4 nm, the thickness for one lattice cannot be ensured in the thickness direction, and consequently the formation of the biaxially oriented layer 22 becomes difficult. Moreover, if the film thickness exceeds 500 nm, it is apprehended that exfoliation arises between upper and lower layers. Accordingly, it is desirable to set the average film thickness within the aforesaid numerical value range. More preferably, the average film thickness of the biaxially oriented layer 22 is within a range from 5 nm to 50 nm. In this range, the in-plane orientation of the layer, such as the cap layer 23, formed on the biaxially oriented layer 22 is improved, and the range is desirable. The intermediate layer 20 is formed to have the whole thickness of 100 nm, and is especially thinned in comparison with that of the case of making the biaxially oriented layer with MgO (see FIG. 4).

EXAMPLES

Table 1 shows examples and comparative examples.

TABLE 1

| | | | BIAXIALLY ORIENTED LAYER | | CHARACTERISTIC EVALUATION | | |
|---|---|---|---|---|---|---|---|
| SAMPLE | BARRIER LAYER | BED LAYER | MATERIAL | THICKNESS [nm] | ORIENTATION | EXFOLIATION | CRITICAL CURRENT |
| #1 | $Al_2O_3$ | — | NbO | 0.4 | Δ | ○ | Δ |
| #2 | $Al_2O_3$ | — | NbO | 0.5 | Δ | ○ | Δ |
| #3 | $Al_2O_3$ | — | NbO | 1 | ○ | ○ | ○ |
| #4 | $Al_2O_3$ | — | NbO | 5 | ◎ | ○ | ◎ |
| #5 | $Al_2O_3$ | — | NbO | 10 | ◎ | ○ | ◎ |
| #6 | $Al_2O_3$ | — | NbO | 30 | ◎ | ○ | ◎ |
| #7 | $Al_2O_3$ | — | NbO | 50 | ◎ | ○ | ◎ |
| #8 | $Al_2O_3$ | — | NbO | 100 | ○ | ○ | ◎ |
| #9 | $Al_2O_3$ | — | NbO | 250 | ○ | ○ | ◎ |
| #10 | $Al_2O_3$ | — | NbO | 300 | ○ | ○ | ◎ |
| #11 | $Al_2O_3$ | — | NbO | 500 | ○ | Δ | ○ |
| #12 | $Al_2O_3$ | — | NbO | 550 | ○ | Δ | ○ |
| #13 | $Al_2O_3$ | — | NbO | 600 | ○ | Δ | ○ |
| #14 | $Cr_2O_3$ | — | NbO | 5 | ◎ | ○ | ◎ |
| #15 | GZO | — | NbO | 5 | ◎ | ○ | ◎ |
| #16 | $Al_2O_3$ | $Y_2O_3$ | MgO | 5 | ◎ | ○ | ◎ |
| #17 | $Al_2O_3$ | — | MgO | 5 | X | ○ | — |
| #18 | $Cr_2O_3$ | $Y_2O_3$ | MgO | 5 | ◎ | ○ | ◎ |

TABLE 1-continued

| | | BIAXIALLY ORIENTED LAYER | | | CHARACTERISTIC EVALUATION | | |
|---|---|---|---|---|---|---|---|
| SAMPLE | BARRIER LAYER | BED LAYER | MATERIAL | THICKNESS [nm] | ORIENTATION | EXFOLIATION | CRITICAL CURRENT |
| #19 | $Cr_2O_3$ | — | MgO | 5 | X | ◯ | — |
| #20 | GZO | — | MgO | 5 | ◯ | Δ | Δ |

In each example (samples 1-15 in Table 1), the barrier layer 21 was formed on the substrate 10 made of tape-shaped HASTELLOY (registered trademark) C276 as a film having a thickness of 50 nm with the use of each material shown in Table 1. Each biaxially oriented layer (IBAD-NbO layers) 22 made of NbO was formed on the barrier layer 21 as a film having thicknesses within a range from 0.4 nm to 600 nm, and each cap layer 23 made of $CeO_2$ was furthermore formed as a film having a thickness of 50 nm.

In each comparative example (samples 16-20 in Table 1), a barrier layer was formed on the tape-shaped substrate made of HASTELLOY (registered trademark) C276 as a film having a thickness of 50 nm with the use of each material shown in Table 1. Moreover, in the samples 16 and 18, each bed layer made of $Y_2O_3$ was formed on the barrier layer as a film having a thickness of 5 nm. Then, each biaxially oriented layer (IBAD-MgO layers) made of MgO was formed on the barrier layer or the bed layer as a film having a thickness of 5 nm, and each cap layer made of $CeO_2$ was furthermore formed as a film having a thickness of 50 nm.

The following evaluations were performed to the examples and the comparative examples.

(1) Orientations (In-Plane Orientations) of Cap Layers

The orientations of the cap layers were evaluated by measuring $\Delta\phi$'s (full widths at half maxima (FWHM)) by the X-ray diffraction method. Here, the $\Delta\phi$'s are indices of the in-plane orientations of the cap layers. The smaller these values are, the higher the in-plane orientations are meant to be. In Table 1, the cases where the $\Delta\phi$'s are each equal to or lower than 8° are denoted by "⊙" (double circles); the cases where the $\Delta\phi$'s are each higher than 8° and equal to or lower than 20° are denoted by "◯" (circles); the cases where the $\Delta\phi$'s are each higher than 20° and equal to or lower than 35° are denoted by "Δ" (triangles); and the cases where the $\Delta\phi$'s are higher than 35° are denoted by "X" (crosses).

(2) Ascertainment of Interlayer Exfoliation

The ascertainment of interlayer exfoliation was performed by observing the surfaces of obtained oxide superconducting wires by the Auger electron spectroscopy. The Auger electron spectroscopy was performed with a PHI-660 type scanning Auger electron spectroscopy analyzer manufactured by Physical Electronics, Inc. The acceleration voltages of an electron gun were set to be 10 kV, and the measurements were performed under the conditions of 500 nA of each of the currents. In Table 1, the states in which exfoliation did not exist completely are denoted by "◯" (circles); the states in which exfoliation arose in parts are denoted by "Δ" (triangles); and the states in which exfoliation arose almost all parts are denoted by "X" (crosses).

(3) Voltage-Current Characteristics

The voltage-current characteristics were measured by the four-terminal method in the state in which parts of the oxide superconducting wires (line widths were each 10 mm) for 200 m were immersed in liquid nitrogen. The measurements were performed by the pitch of 1 m; the voltage terminals were set to be 1.2 m. The critical currents Ic was obtained from the voltage-current characteristics which is defined at the electric field criterion of 1 μV/cm. In Table 1, the cases where the critical current Ic was 200 A or more are denoted by "⊙" (double circles); the cases where the critical current Ic was within a range from 150 A or more to below 200 A are denoted by "◯" (circles); and the cases where the critical currents Ic was less than 150 A are denoted by "Δ" (triangles).

Because the biaxially oriented layers made of MgO were formed directly on the barrier layers in the samples 17 and 19 of the comparative examples, MgO reacted with Al or Cr in the barrier layers, and Mg—Al—O compounds or Mg—Cr—O compounds were formed. Accordingly, the formation of the biaxially oriented layers made of MgO was prevented, and the orientations of the cap layers formed on the biaxially oriented layers were bad to make it impossible to make currents flow as the superconducting wires. Accordingly, reaction suppressing layers (bed layers) made of yttria ($Y_2O_3$) or the like are generally inserted between the barrier layers and the biaxially oriented layers (samples 16 and 18). Consequently, if MgO is used as a biaxially oriented layer, the intermediate layer is led to take a multilayer structure.

On the other hand, in the samples 1-14, the biaxially oriented layers made of NbO were formed directly on the barrier layers. The reactivity of NbO with Al and Cr of the barrier layers is low. Accordingly, the biaxially oriented layers functioned without any problems, and the orientations of the cap layers were good to make it enable to make currents flow as superconducting wires. Moreover, by using the biaxially oriented layers made of NbO, being bed layer-free became realizable, and the thinning and the simplification of the intermediate layers were attained.

When the thicknesses of the biaxially oriented layers were changed to be within the range from 0.4 nm to 600 nm in the samples 1-13, the orientations of the cap layers were good when the thicknesses of the biaxially oriented layers were 1 nm or more, and further preferable results were obtained from the ones within a range from 5 nm or more to below 300 nm. However, when the thicknesses of the biaxially oriented layers were 500 nm or more, the biaxially oriented layers became too thick, and consequently, for example, exfoliation arose between the metal substrates and the barrier layers. By the influences of the orientations and the exfoliation, the voltage-current characteristics of the obtained superconducting wires resulted in being good when the film thicknesses of the biaxially oriented layers were each 5 nm or more. Furthermore, the voltage-current characteristics resulted in being optimal when the film thicknesses of the biaxially oriented layers were within a range from 5 nm to 300 nm both inclusive. Moreover, when the film thicknesses of the biaxially oriented layers were in a range from 5 nm to 50 nm both inclusive, the orientations of the cap layers became the optimal states, and the film thicknesses in the range were most preferable.

In the sample 15 of the examples and the sample 20 of the comparative examples, GZO was used as the barrier layers. If the barrier layer was made of GZO and the biaxially oriented layer was made of NbO like the sample 15, the orientation of the cap layer was good, and no interlayer exfoliation arose.

On the other hand, if the barrier layer was made of GZO and the biaxially oriented layer was made of MgO like the sample 20, the orientation of the cap layer was lower than sample 15 because the reactivity of MgO with the air was high, and consequently $Mg(OH)_2$ and $MgCO_3$ were produced by the reactions with moisture and carbon dioxide in the manufacturing process. Moreover, by the reaction products with the moisture and the carbon dioxide, interlayer exfoliation arose in the biaxially oriented layer made of MgO and the layer contacting with the biaxially oriented layer, and the voltage-current characteristics was deteriorated as the result.

From the above results, it was ascertained that the cap layers 23 in the tape-shaped bases for a superconducting wire 2 of the examples had high biaxial orientations. Moreover, it was ascertained that good bondability was ensured at the interfaces between the cap layers 23 and the biaxially oriented layers 22.

As described above, the tape-shaped base (2) for a superconducting wire according to the embodiment is composed of the intermediate layer (20) formed on the metal substrate (10). Then, the intermediate layer (20) includes the biaxially oriented layer (22) made of niobium monoxide (NbO) formed by depositing the evaporated particles flicked out from the target (103) on the deposition aspect (DA). The average film thickness of the biaxially oriented layer (22) is desirably within a range from 0.4 nm to 500 nm.

Because the biaxially oriented layer is made of NbO, it is possible to omit the bed layer, which is necessary at the time of making the biaxially oriented layer out of MgO. Consequently, the thinning and the simplification of the intermediate layer can be achieved in comparison with the case where the biaxially oriented layer is made of MgO. Then, by using such a tape-shaped base for a superconducting wire, the cost reduction of the superconducting wire can be achieved.

Moreover, because the corrosion resistance and the exfoliation strength of the biaxially oriented layer are improved, the characteristics (voltage-current characteristics and handling performance) at the time of being formed as the superconducting wire can be improved.

In the present embodiment, the biaxially oriented layer 22, made of NbO, is formed while radiating an ion beam to the deposition aspect from an oblique direction, that is, by the IBAD method. Thereby, the film of the biaxially oriented layer 22 made of a high density rock salt type NbO can be formed.

The invention devised by the inventor has concretely been described above on the basis of the embodiment, but the present invention is not limited to the aforesaid embodiment, and the embodiment can be changed without departing from the spirit and scope of the invention.

For example, as the structure of the intermediate layer including the IBAD-NbO layer, the following structures can be considered besides those shown in the examples.

(1) $CeO_2$/Epi-NbO/IBAD-NbO/barrier layer/substrate
(2) $CeO_2$/LMO/IBAD-NbO/barrier layer/substrate
(3) $CeO_2$/LMO/Epi-NbO/IBAD-NbO/barrier layer/substrate
(4) LMO/Epi-NbO/IBAD-NbO/barrier layer/substrate
(5) STO/Epi-NbO/IBAD-NbO/barrier layer/substrate
(6) Epi-NbO/IBAD-NbO/barrier layer/substrate
(7) LMO/IBAD-NbO/barrier layer/substrate
(8) STO/IBAD-NbO/barrier layer/substrate
(9) IBAD-NbO/barrier layer/substrate Incidentally, GZO, LMO, and STO in (1)-(9) are abbreviations of Gd—Zr—O ($Gd_2Zr_2O_{7-x}$, $-1<x<1$), La—Mn—O ($LaMnO_{3-x}$, $-1<x<1$), and Sr—Ti—O ($SrTiO_{3-x}$, $-1<x<1$), respectively. Moreover, IBAD-NbO is an NbO layer formed as a film by the IBAD method, and Epi-NbO is a self oriented NbO layer epitaxially grown on an IBAD-NbO layer by the PLD method or the like.

That is, in the tape-shaped base for a superconducting wire 2 shown in FIG. 2, the cap layer 23 can be composed of one kind of $CeO_2$, LMO, and STO or a combination of two kinds of them, or a structure having no cap layer 23 may be adopted. The biaxially oriented layer 22 can be composed of a single layer of IBAD-NbO, or a composite layer of Epi-NbO and IBAD-NbO.

Moreover, although the cases where the barrier layer 21 is composed of $Al_2O_3$, $Cr_2O_3$, or GZO have been shown in the embodiment, the barrier layers 21 can be composed of YAlO, YSZ, $Y_2O_3$, $Gd_2O_3$, $B_2O_3$, $Sc_2O_3$, or the like in place of the aforesaid compounds. As the metal substrate 10, a non-oriented metal substrate other than HASTELLOY, such as SUS 304 can be applied.

Incidentally, although the cap layer 23 can be omitted, it is desirable that the barrier layer 21 is provided for preventing the diffusion of the constituent elements (for example, Ni) of the metal substrate 10.

The embodiment disclosed in this description should be regarded as being an illustration in all of the points thereof and not being restrictive. The scope of the present invention is intended not to be shown by the above description, but to be shown by the claims, and to include all changes within the scope of the claims and equivalents thereof.

DESCRIPTION OF REFERENCE NUMERALS 10 metal substrate
20 intermediate layer
21 barrier layer
22 biaxially oriented layer (IBAD-NbO)
23 cap layer ($CeO_2$)
30 superconducting layer (YBCO)
40 stabilization layer

What is claimed is:

1. A superconducting wire comprising a tape-shaped base for the superconducting wire comprising a non-oriented metal substrate and an intermediate layer formed on the metal substrate, and a superconducting layer formed on the surface of the tape-shaped base for the superconducting wire, wherein
the intermediate layer includes a biaxially oriented layer which consists essentially of niobium monoxide formed by deposition of particles evaporated from an evaporation source and deposited onto a deposition aspect.

2. The superconducting wire according to claim 1, wherein an average film thickness of the biaxially oriented layer is within a range of 0.4-500 nm.

3. The superconducting wire according to claim 1, wherein the intermediate layer includes a diffusion preventing layer formed on a surface of the metal substrate.

4. The superconducting wire according to claim 3, wherein the diffusion preventing layer consists essentially of a material selected from the group consisting of $Al_2O_3$ and $Cr_2O_3$.

5. The superconducting wire according to claim 1, wherein the biaxially oriented layer is formed by the deposition of the particles evaporated from the evaporation source and deposited onto the deposition aspect while radiating an ion beam from an oblique direction to the deposition aspect.

6. The superconducting wire according to claim 1, wherein the intermediate layer includes a cap layer formed on a surface of the biaxially oriented layer.

7. The superconducting wire according to claim 4, wherein the biaxially oriented layer is formed directly on the diffusion preventing layer.

8. A superconducting wire comprising a tape-shaped base for the superconducting wire comprising a non-oriented metal substrate and an intermediate layer formed on the metal substrate, and a superconducting layer formed on the surface of the tape-shaped base for the superconducting wire, wherein the intermediate layer includes a biaxially oriented layer which consists essentially of rock salt type niobium monoxide.

\* \* \* \* \*